US008286043B2

(12) United States Patent
Sakada et al.

(10) Patent No.: US 8,286,043 B2

(45) Date of Patent: Oct. 9, 2012

(54) SYSTEM, COMPUTER PROGRAM PRODUCT AND METHOD FOR TESTING A LOGIC CIRCUIT

(75) Inventors: Oleksandr Sakada, Munich (DE); Florian Bogenberger, Poing (DE)

(73) Assignee: Freescale Semiconductor, Inc., Austin, TX (US)

( * ) Notice: Subject to any disclaimer, the term of this patent is extended or adjusted under 35 U.S.C. 154(b) by 487 days.

(21) Appl. No.: 12/527,347

(22) PCT Filed: Feb. 16, 2007

(86) PCT No.: PCT/IB2007/050518

§ 371 (c)(1), (2), (4) Date: Aug. 14, 2009

(87) PCT Pub. No.: WO2008/099239

PCT Pub. Date: Aug. 21, 2008

(65) Prior Publication Data

US 2010/0107025 A1 Apr. 29, 2010

(51) Int. Cl.

*G01R 31/28* (2006.01)
*G01R 31/26* (2006.01)
*G01R 31/02* (2006.01)

(52) U.S. Cl. ........ 714/733; 714/724; 714/735; 714/736; 714/742; 324/762.01; 324/762.02; 324/762.03; 324/762.05

(58) Field of Classification Search .................. 714/724, 714/733, 735, 736, 742; 324/762.01, 762.02, 324/762.03, 762.05

See application file for complete search history.

(56) References Cited

U.S. PATENT DOCUMENTS 5,940,588 A * 8/1999 Kikinis ........................... 714/28
5,963,566 A * 10/1999 Rajsuman et al. ............ 714/733
6,070,252 A 5/2000 Xu et al.

(Continued)

FOREIGN PATENT DOCUMENTS

DE 1282041 A2 * 2/2003

(Continued)

OTHER PUBLICATIONS

Johnson et al., A Survey of Fault Simulation, Fault Grading and Test Pattern Generation Techniques With Emphasis on the Feasibility of VHDL Based Fault Simulation, Oct. 1997, Rome Laboratories, pp. 1-130.*

(Continued)

*Primary Examiner* — John J Tabone, Jr.

(57) ABSTRACT

A system for testing a logic circuit which has two or more test routine modules. Each module contains a set of instructions which is executable by (a part of) the logic circuit. The set forms a test routine for performing a self-test by the part of the logic circuit. The self-test includes the part of the logic circuit testing itself for faulty behavior, and the part of the logic circuit determining a self-test result of the testing. The system includes a test module which can execute a test application which subjects the logic circuit to a test by performing the self-test on at least a part of the logic circuit by causes the part of the logic circuit to execute a selected test routine, and determining, by the test module, an overall test result at least based on a performed self-tests. The test module includes a control output interface for activates the execution of the a selected test routine. A second test module input interface can receive the self-test result from a selected test routine. At a test module output interface the overall test result may be outputted. The test routine includes instructions for outputting, by the part of the logic circuit, data to a test routine output interface which is not connected to the second test module input interface, for outputting information about the self-test result by the test routines without passing the information through the test module.

19 Claims, 2 Drawing Sheets

U.S. PATENT DOCUMENTS

| | | | | |
|---|---|---|---|---|
| 6,311,300 | B1 | 10/2001 | Omura et al. | |
| 6,415,406 | B1 | 7/2002 | Kaiser et al. | |
| 6,560,740 | B1 * | 5/2003 | Zuraski et al. | 714/733 |
| 7,213,182 | B2 * | 5/2007 | Kobayashi | 714/724 |
| 7,231,621 | B1 * | 6/2007 | Herron et al. | 716/108 |
| 7,328,388 | B2 * | 2/2008 | Hii et al. | 714/733 |
| 7,472,327 | B2 * | 12/2008 | Nakayama | 714/738 |
| 7,484,141 | B2 * | 1/2009 | Shikata | 714/718 |
| 2003/0226061 | A1 | 12/2003 | Gender | |
| 2008/0115026 | A1 * | 5/2008 | Dieffenderfer et al. | 714/733 |

FOREIGN PATENT DOCUMENTS

| | | | |
|---|---|---|---|
| EP | 1282041 | B1 | 4/2002 |

OTHER PUBLICATIONS

International Search Report and Written Opinion correlating to PCT/IB2007/050518 dated Nov. 7, 2007.

* cited by examiner

SYSTEM, COMPUTER PROGRAM PRODUCT AND METHOD FOR TESTING A LOGIC CIRCUIT

FIELD OF THE INVENTION

This invention relates to a system for testing a logic circuit. The invention further relates to an assembly and to an apparatus including such a system, to a computer program product and to a method for testing a logic circuit.

BACKGROUND OF THE INVENTION

Systems for testing logic circuits are known in the field of data processing. For example, it is known to test digital processors with so called 'self-test software' for digital processors used for safety relevant applications or other applications which require a high reliability or operational availability, such as chassis control or power train control in vehicles. The self-test software is typically embedded in the application run by the digital processor and consists of a set of test routines, and an interfacing program between the test routines and the user application. Each test routine represents a piece of code which is designed to perform a test on a part of the logic circuit in order to detect physical defects. The test routine reports a result of the test to the interfacing program. The interfacing program determines an overall result from the test results reported by the individual test routines.

Self-test software is often used in safety relevant applications, such as control of cars or airplanes, and it is often required to demonstrate that self-test software meets the safety requirements for which usually strong evidence is needed. To establish to a sufficient extend that the self-test software meets the safety requirements, un-quantified claims are not sufficient. Instead, it needs to be proved that the self-test software does indeed detect faults in the logic circuit. This proof can be obtained by using an abstract, mathematical approach or, alternatively, by fault grading, that is by simulating the relevant fault scenarios and observing the behaviour of the self-test software. in order to provide the required proof, it is known to fault grade the test routines individually, by simulating a number of faults and to determine the number of fault detected by the specific test routine.

However, a disadvantage of the known systems is that the propagation of the test result from the test routine to the application can suffer from fault masking, so even though the test routine detects the fault it may become invisible to the application due to the fault.

Another disadvantage is that, in case the operation of the interfacing program is controlled, and hence influenced, by the application, it is difficult to fault grade the interfacing program itself in particular because the interfacing program is typically provided separately from the application.

SUMMARY OF THE INVENTION

The present invention provides a system, an assembly, an apparatus, computer program products and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE PREFERRED EMBODIMENTS

Figure 1:
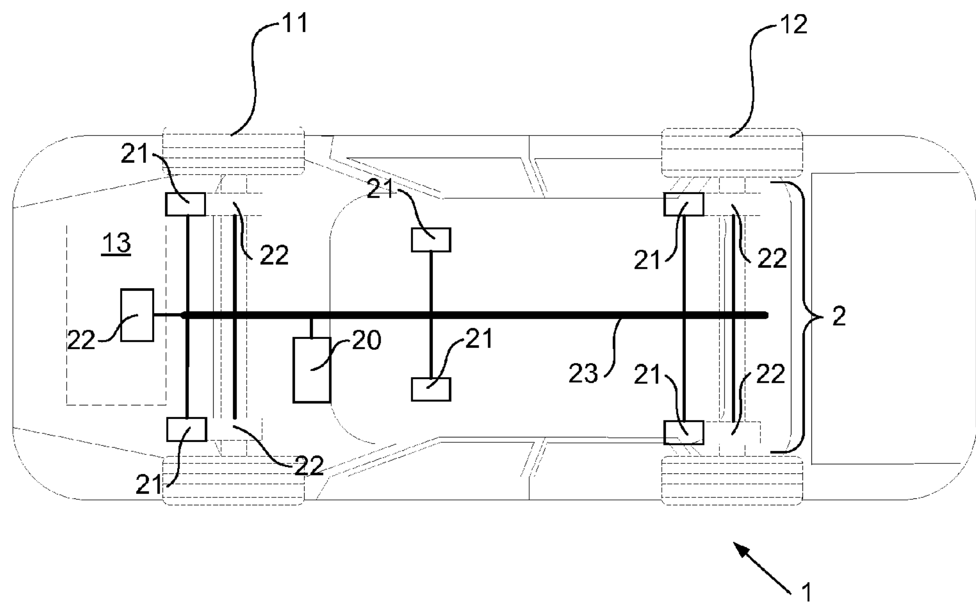
FIG. 1 shows an example of an embodiment of an apparatus in which a system for testing a logic circuit may be used.

Referring to FIG. 1, an example of an apparatus is shown therein. The example shown in FIG. 1, is a motorised vehicle, and more in particular is a car 1. The car 1 may include an assembly 2 of a logic circuit 20 and a test system 25 (For sake of simplicity the test system 25 is not shown in FIG. 1.).

The logic circuit 20 may, as is explained below in more detail, for example execute a data processing application (APP) 24. The data processing application may for instance be a control application for controlling the operation of a physical device and for instance control a part of the vehicle, such as for example an electronic stability control application. However, the data processing application may also be another type of application, and for example be an application which controls a medical system such as a patient monitoring system, a security application, for example an application which controls financial transactions or encrypts data or any other type of application that requires the logic circuit on which the application is running to be tested.

The data processing application 24 may, for instance, control actuators 22 to correct the movement of the car 1. The data processing application 24 may, for example, control individual brakes acting on the front wheels 11 or the rear wheels 12 and/or control the power of an engine 13, in order to correct, for example, under-steer or over-steer of the car 1. The data processing application 24 may further control the actuators 22 based on the information provided by sensor 21, for example in order to prevent the car 1 from slipping or otherwise correct the movement of the car 1.

The logic circuit 20 may for example be connected to sensors 21 and actuators 22. The assembly 2 may, as shown in the example of FIG. 1, include a bus 23 which connects the sensors 21 and actuators 22 to the logic circuit 20. For instance, the logic circuit 20 may receive from the sensors 21 signals representing information about, for example, the acceleration and/or rotation of the car 1. The logic circuit 20 may for instance receive from the sensors 21 information about a driver's intended direction in steering and braking inputs given by the driver, for instance by sensing movement of a steering wheel or a braking paddle, and/or information about to the vehicle's response, for example in terms of the lateral acceleration, rotation and individual wheel speeds. The data processing application 24 may use the information from the sensors 21 to control the actuators 22 and hence, for example, provide an electronic stability control (ESC) to the vehicle.

Figure 2:
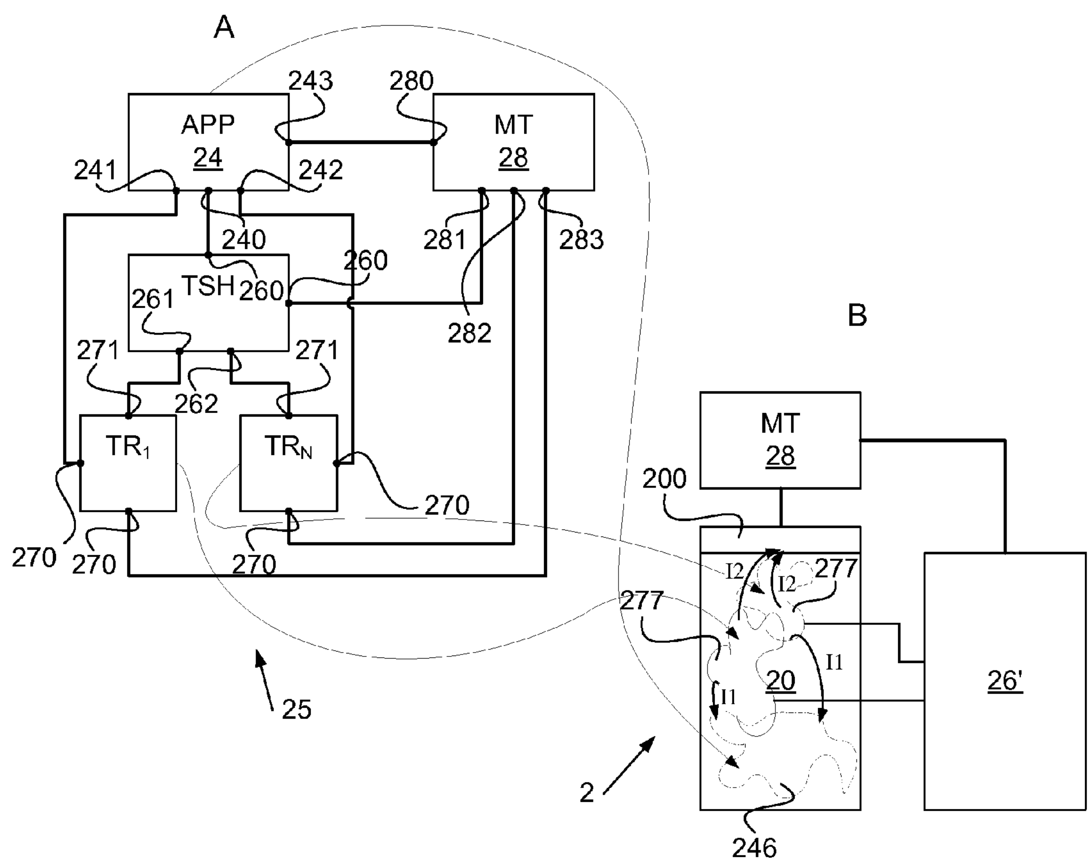
FIG. 2A shows a block diagram of hierarchical representation of a first example of an embodiment of a system for testing a logic circuit and FIG. 2B shows a block diagram of a hardware representation of the first example.

Referring to FIG. 2, the assembly 2 may include a test system 25. The test system 25 may be arranged to test the logic circuit 20. The test system 25 may for instance include a test module 26 and/or two or more test routine modules 27.

As illustrated in FIG. 2A, the test module 26 may for instance execute a test application TSH which subjects the logic circuit 20 to a test by causing an execution of a self-test by one or more parts 277 of the logic circuit 20, for instance by having the respective part 277 of the logic circuit 20 executing one or more selected test routines TR1 . . . TRN. The test module 26 may determine an overall test result at least based on one or more performed self-tests. The test routine modules 27 may each contain a set of instructions forming a test routine $TR_1 \ldots TR_N$ for performing a self-test by the part 277 of the logic circuit 20. The test routine $TR_1 \ldots TR_N$ may be executable by at least a part 277 of the logic circuit 20, as is illustrated in FIGS. 2A and 2B with the arrows between the test routines $TR_1 \ldots TR_N$ and the parts 277 of the logic circuit 20. When performing the self-test, the respective part 277 of the logic circuit 20 may test itself for faulty behaviour and determine a self-test result of the testing.

The test module 26 may include one or more control output interfaces and/or one or more first test module input interfaces connected to the test routine modules 27. In FIG. 2A, for instance, the control output interfaces and the test module input interfaces are shown as input/output (I/O) interfaces 261,262 of the test application TSH in which the control output interfaces and the test module input interfaces are combined. However, the test module 26 may include separate control output interfaces and test module input interfaces. The I/O interfaces 261,262 may be connected to respective input/output interfaces of the test routine modules 270. As shown in FIG. 2A, the I/O interfaces 261,262 may for example be connected to respective input/output interfaces 271 of the test routines TR1 . . . TRN.

The test routine $TR_1 \ldots TR_N$ may include instructions for outputting, by the part of the logic circuit 20, data to a test routine output interface which is not connected to the second test module input interfaces. Thus, the test routine may output information about the self-test result without passing the information through the test module 26. Thereby, the result of a test routine may be propagated directly to the data processing application 24 or another component, unit or device, such as the monitoring unit 28. Since the test routine can be fault graded, by outputting the test result without passing through the test module 26, the risk that the output is affected by fault masking in the test module 26 may be reduced, and accordingly the actual test coverage may be proven based on the fault grading of the test routine. Accordingly, it can be ascertained to a larger extend that the test application TSH will indeed detect faults when they occur. Furthermore, the chance that a fault is masked by the data processing application 24 may be reduced, since the data processing application 24 has a redundancy in the inputs at which test result can be received, e.g. inputs 240 and 242, and data presented at different input are usually processed differently.

As for example shown in the hierarchical representation of FIG. 2A, the test routine $TR_1 \ldots TR_N$ may include instructions for outputting data at a test routine output interface 270 which is not connected to the I/O interface 261,262. Thus, the test routine $TR_1 \ldots TR_N$ may output information about the self-test result without passing the information through the test application TSH. The test routine output interface 270 may for instance be connected to an interface 241,242 of the data processing application 24 and/or be connected to an interface 282,283 of the monitoring unit 28. Accordingly, via the test routine output interface 270, information may be inputted at an interface 241,242 of a data processing application 24 or to an interface 282,283 of a monitoring unit 28 without passing through the test module 26 (and/or through the data processing application 24).

Referring to the hardware representation of FIG. 2B, for instance, a self-testing part 277 of the logic circuit 20 which, caused by for instance a separate device 26' executing the test application TSH, executes a test routine $TR_1 \ldots TR_N$ (and hence self-tests itself) may output the information to parts 246 of the logic circuit 20 which execute the data processing application 24 without requiring execution of instructions of the test application TSH. (In FIG. 2B, this is represented with arrows 11 which are connection the self-testing part 277 to part 246 without passing through a separate device 26' which can execute the functions of the test module 26). For example, the self-testing part 277 may for instance output the information to the part 246 directly or output the information to a memory or component outside the logic circuit, e.g. without passing through other parts of the logic circuit. The information stored outside the logic circuit may then be accessed by the part 246 executing the data processing application 24 or other parts of the logic circuit.

The self-testing part 277 may in addition or alternatively output the information to a device outside the logic circuit 20, such as (in the example of FIG. 2B) to the monitoring unit 28. For instance, the self-testing part 277 may output the information to IO communication hardware, such as input/output logic 200 which connects the logic circuit 20 to the other device 28 The self-testing part 277 may output the information to the other device 28 without requiring, for this outputting, the execution of any other instructions by the logic circuit 20. (In FIG. 2B, this is represented with the arrows 12, which connect the self-testing part 277 to I/O logic 200 without passing through the separate device 26' which can execute the functions of the test module 26 or passing through the part indicated with reference number 246). As e.g. shown in FIG. 3, the self-testing part 277 may present the information at an output 201 of the logic circuit 20, for instance without requiring, for this outputting, the execution of instructions of the test application and/or without requiring, for this outputting, the execution of instructions of the data processing application. (In FIG. 3, this is represented by the line connecting a part 277 to an output 201, without passing through a part 266 executing the function of the test module 26) and/or without requiring the execution a data processing application 24 by a part 246.

Figure 3:
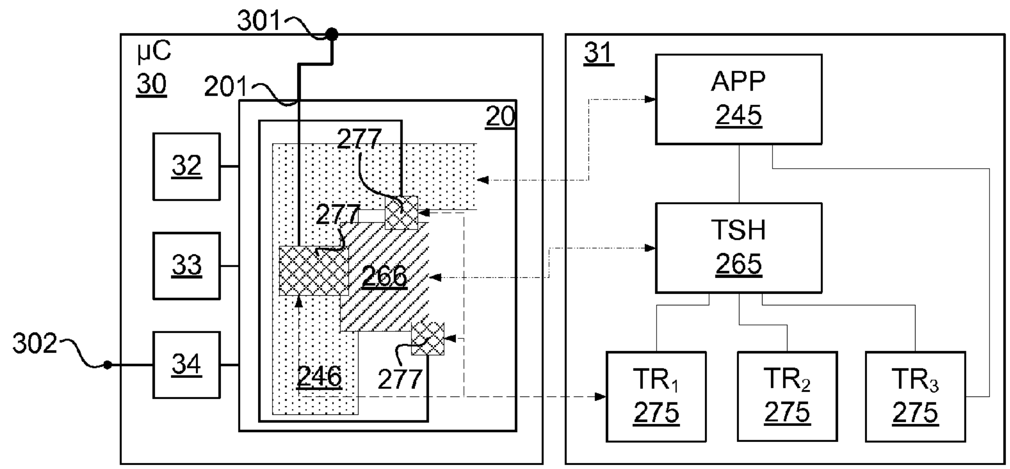
FIG. 3 shows a block diagram of a hardware representation of an example of an embodiment of an assembly with a system for testing a logic circuit in accordance with an embodiment of the invention.

The test routine modules 27 may be implemented in any manner suitable to self-test a part of the logic circuit 20. For instance, as shown in FIG. 3, the test routine modules 27 may for example include one or more memory units 31 in which data 275 can be stored, the data representing instructions executable by the logic circuit 20. Upon activation of the respective test routine $TR_1 \ldots TR_N$ by the test module 26, the part 277 of the logic circuit 20 may initiate executing the instructions defined in the memory unit 275. (In FIG. 3, for sake of clarity, the hierarchical relationship between the test routines $TR_1 \ldots TR_N$, the test application TSH and the data processing application APP are indicated with the hairlines connecting data 245,265,275)

The self-testing part(s) 277 may for instance, in accordance with the test routine $TR_1 \ldots TR_N$, perform a logic tests with the logic circuit 20. For instance, the self-testing part(s) 277 may perform a logic test by having the self-testing part 277 (which may be a part or the entire logic circuit) of the logic circuit performing a predetermined type operation, such a binary operation (for example an exclusive OR) or a calculation (for example a square root calculation). For instance, the test routine 27 may input predetermined test data in the self-tested part 277 of the logic circuit 20, make the self-testing part(s) 277 of the logic circuit perform a predetermined type of test operation and monitor the data output by the self-testing part of the logic circuit 20 after the test operation.

The test routine $TR_1 \ldots TR_N$ may be any routine suitable for the self-testing parts 277 to detect a faulty behaviour on their sides. The self-testing part 277 executing a test routine $TR_1 \ldots TR_N$ may for instance determine a self-test signature, such as an N-bit number, and, for example, check the correctness of the self-test signature. The self-testing part 277 executing a test routine $TR_1, TR_N$ may for instance compare the self-test signature with a predetermined signature to determine whether or not the test routine has detected a fault in the logic circuit 20. For instance, in case the self-test signature does not correspond to a sufficient degree to the predetermined signature, the self-testing part 277 executing a test routine $TR_1, TR_N$ may determine that the test routine has detected a fault in the logic circuit 20, and else that the test routine has not detected a fault in the logic circuit 20. The self-testing part 277 executing a test routine $TR_1 \ldots TR_N$ may output, for instance to the test module 26 or to the data processing application 24 the determined outcome and/or the self-test signature. The test routine module 27 may contain a set of instructions for example defining an operation which may be described with the following pseudo-code:

```
start
{
perform self-test and determine test_signature
if test_signature== predetermined signature
   then test_result= correct
   else test_result= fault
output= test_result
}
end
```

The self-testing part 277 may determine the self-test signature in any suitable manner. For example, the part 277 of the logic circuit 20 may perform, in accordance with the instructions, one or more predetermined operations which change the state of (the self testing part 277 of) the logic circuit 20. The self testing part 277 may for instance determine a signature value which is unique for the sequence of state transitions of the logic circuit 20 or for which only a very small chance exists that another sequence of state transitions will give the same value. The part 277 may then determine the correctness of the determined signature value, for example by comparing the determined signature value with a predetermined signature value. In case the determined signature value is not correct, this implies that the self-testing part 277 exhibits a faulty behaviour and accordingly that the result of the self-test is that the self-testing part 277 has failed the self test. The self-testing part 277 may output the result of the self-test, for example as data including the self-test signature and the determined outcome of the self-test using the interfaces 270, 271, to the test module 26 and/or other components units or devices, such as the data processing application 24 or the monitoring unit 28.

The test routines $TR_1 \ldots TR_N$ may each include instructions for testing different parts of the logic circuit 20. As illustrated in FIG. 3, for instance one or more of the test routines $TR_A$ may, when executed, self-test a first part 277 of the logic circuit 20. One or more other test routines $TR_B$ may, when executed, self-test a second part 277 of the logic circuit 20. As shown in FIG. 2B, the test routines $TR_1, TR_N$ may for example test (partially) overlapping parts 277 of the logic circuit 20. As shown in FIG. 3, the self-testing parts 277 may have an overlap with, for example, a part 246 of the logic circuit 20 executing a data processing application APP or with a part 266 of the logic circuit 20 executing the test application TSH. Furthermore, the parts 277 executing the test routines $TR_1, TR_N$ may operate independently from each other, e.g. by executing the test routines $TR_1, TR_N$ at different points in time and for example use different resources, with or without any overlap in the parts 277 of the logic circuit 20 executing the test routine. Thereby, the chance that intermittent faults, or faults caused by effects which do not cause a physical defect (e.g. EMC), are detected may be increased, (for example when the areas in the overlaps are tested at different points in time). Furthermore, when the self-testing parts 277 do not overlap completely, an analysis of multiple self-test results enables a more precise location of a fault and therefore to determine more accurately its severity for the data processing application.

One or more of the test routine modules 27 may, for example, include a set of instructions which, when executed, enable testing of the test routine output interface 271. Thereby, it can be verified more profoundly that the system 2 will accurately notify detected faults. Such an output test routine may for example transmit a predetermined artificial test result to the test routine output interface 271. The artificial test result may for example be transmitted by the data processing application 24 and/or the test module 26 and/or the monitoring unit 28. The data processing application 24 and/or the test module 26 and/or the monitoring unit 28 may receive the artificial test result. In case the received test result is the same as the predetermined artificial test result, this implies that the test routine output interface 270, the input/output interfaces 271, the I/O interface 240-242 resp. 260-262, the interface 280-283 of the monitoring unit 28 and the connection between those, are functioning correctly. In case the received test result differs from the predetermined artificial test result, this implies that the respective path along which the artificial test result has been propagated, or a part of module 20, is faulty. The predetermined artificial test result may be any type suitable to test a path, and for example be the result of a simulated fault in the logic circuit 20.

The test module 26 may be implemented in any manner suitable for the specific implementation. As shown in FIG. 2B, the test module 26 may for example be implemented as a device 26' separate from the self-testing logic circuit 20. The separate device 26' may be connected to the logic circuit 20 and be able to activate the self-tests of the respective parts 277 and to receive from the logic circuit 20 self-tests results from the parts 277. However, as shown in FIG. 3, the test module 26 may for example be running on the logic circuit 20 that includes the self-testing parts 277 and include a memory unit 31 in which data 265 which represents at least one set of instructions executable by said logic circuit 20 are stored, the set forming test application TSH.

The test module 26 may, for example, include a second test module input interface and/or a test output interface. The second test module input interface and/or a test output interface may for example be implemented as an input/output (I/O) interface, as illustrated in the hierarchical representation of FIG. 2A. However, the test module 26 may include a separate second test module input interface and a separate test output interface. In the example of FIG. 2A, the I/O interface 260 connects the test application TSH to an input/output interface 240 of the data processing application APP 24 and to an interface 281 of the monitoring unit 28. However, the test module 26 may be connected to other components, units or devices. For example, the I/O interface 260 may be connected to a start-up module of the logic circuit 20 which controls the initialization of the logic circuit 20.

The test module 26 may for instance, in accordance with instructions of the test application TSH, determine an overall test result based on information about the self-test received via the I/O interfaces 261,262. The hardware executing the test module 26, such as the separate device 26' or a part 266 of the logic circuit 20, may for example provide the overall test result to a part of the logic circuit 20, such as a part 246 executing the data processing application 24, via the I/O interface 260, and/or to other devices, such as the monitoring unit 28.

The test module 26 may for example determine that the logic circuit 20 failed the test (that is: the logic circuit 20 did exhibit a faulty behaviour), when one or more of the self-test results indicate a fault in the logic circuit 20 or when a self-test returns an unexpected result or no result at all. For instance, the test module 26 may for example determine that the logic circuit 20 failed the test if a current self-test does not return a result within a predetermined period of time after starting the self-test. The test module 26 may then output a test failed message to the data processing application 24, via the I/O interfaces 260,240. The test passed message may for instance include a code which enables a determination of the self-testing part 277 that failed the self-test and/or what type of fault occurred. The test module 26 may for instance output the fault message, to the data processing application 24, when a test result indicating a fault is returned from a self-testing part to the test module 26, without waiting for the other self-testing part to return their self-test results.

The test module 26 may for example determine that the logic circuit 20 passed the test (that is: the logic circuit 20 did not exhibit a faulty behaviour) when none of the self-test results indicates a fault in the logic circuit 20. The test module 26 may then output a test passed message to the data processing application 24, via the I/O interfaces 260,240.

The test passed message and/or the test failed message may for example include a code which enables a verification of the overall test result by the data processing application 24. For instance, each of the test routines $TR_1$, $TR_N$ may determine a signature value, for instance an N-bit number (N being, for instance 8, 16, 24, 32, 64 or any other suitable number) which represents the outcome of the test routine. The test module 26 may receive the N-bit numbers and, when the logic circuit 20 passed the tests of respective test routines, calculate an overall test value from the N-bit numbers. The test module 26 may for example perform an XOR operation on the N-bit numbers and output the XOR value resulting from this operation to the data processing application 24, the monitoring unit 28 or other component, unit or device.

The test module 26 may receive a test request at the second test module input interface 260. The test module 26 may for instance activate, in response to the test request, one or more of the test routine modules 27. The test module 26 may for example execute the test application TSH in response to a test request received at the I/O interface 260. The data processing application 24 in this manner for instance activate the test module during execution of the data processing application APP by the data processing application. Thereby, for instance, the logic circuit 20 can be checked for faults when enhanced safety is required, e.g. when a car is riding or a plane is flying. However, the test module 26 may also execute the test application during start-up of the data processing application 24 or when the logic circuit 20 is initialized in order to verify that the logic circuit 20 will behave correctly.

The test module 26 may initiate the test routines in any suitable manner. For example, the test module 26 may activate a sequence of test routines in a predetermined order. The test module 26 may for instance activate a following test routine only when the test routine directly preceding the following test routine has returned a positive test result, that is that the directly preceding test routine has not detected a fault in the part of the logic circuit 20 tested by the directly preceding test routine. The test module 26 may for instance terminate the predetermined order when a test result indicating a fault is returned from a test routine module 27 to the test module 26, that is the test module 26 may refrain from initiating the test routines of the sequence that have not been initiated yet.

The component, unit or device receiving the test failed message or the test passed message and/or the information via the test routine output interface 270, may, in response to the message, perform any operation suitable for the specific implementation. For example, the data processing application 24 and/or the monitoring unit 28 may, in response to the information received from the test module 26 or from the test routine output interface 270, for instance compare the detected fault with one or more predetermined criteria. The data processing application 24 and/or the monitoring unit 28 may for example determine the severity of the detected fault in relation to the application. The data processing application 24 and/or the monitoring unit 28 may perform one or more operation based on the comparison. The data processing application 24 and/or the monitoring unit 28 may for example sent a test request to the test module 26 (or, via the interface 270, to the test routine module 27) to perform the test again. Thereby, for example, the data processing application 24 may check if the fault is permanent or temporary.

The data processing application 24 and/or the monitoring unit 28 may, in response to a test failed message, for example switch the application and/or the logic circuit 20 and/or a system which includes the logic circuit 20 to a safe state. The data processing application 24 and/or the monitoring unit 28 may for instance halt or reset the respective entity. The data processing application 24 and/or the monitoring unit 28 may also switch the respective entity to a limp-home mode, that is a mode in which the respective entity does not exhibit a normal performance but the parameters of the entity are set to attempt to overcome the effects of the fault, for example in order to place the entity in a state which enables e.g. the apparatus to be brought to a service area. Also, the data processing application 24 and/or the monitoring unit 28 may for example activate a redundant system, such as transfer control to a hot-standby system, to take over the functions of the respective entity.

As shown in FIGS. 2-3, the test system 25 may include a monitoring unit 28. The monitoring unit 28 may for instance be implemented on a logic circuit separate from the logic circuit 20 which executed the self-test. For example, the monitoring unit 28 may be implemented as a microprocessor programmed to monitor the logic circuit 20. As shown in FIG. 2B, the monitoring unit 28 may be connected to the logic circuit 20. As shown in FIG. 2A, the monitoring unit 28 may be connected with an monitoring unit input interface 280 to an output interface 243 of the data processing application 24. As shown in FIG. 2A, a monitoring unit input interface 282,283 may also be connected to the test routines output interface 270. An interface 281 of the monitoring unit 280 may be connected to the test module 26.

The monitoring unit 28 may receive at the monitoring unit input interface 280 integrity information about the integrity of the logic circuit 20. The monitoring unit 28 may control the data processing application 24 and/or other parts of the logic circuit based on the integrity information. For instance, the monitoring unit 28 may include a timing device that triggers a test, e.g. of the data processing application 24 or the logic circuit 20, if a timing threshold is exceeded. The monitoring unit 28 may reset the timer if a test passed message is received, for example from the data processing application 24 or the test module 26. The monitoring unit 28 may perform some actions, such as resetting the logic circuit 20 or running a diagnostic test, in case the test passed message is not received before the timing threshold is exceeded. Thereby, the logic circuit 20 and/or the data processing application 24 may be brought back from the hang state into normal operation.

The logic circuit 20 may be implemented in any manner suitable for the specific implementation. The logic circuit 20 may for instance be a programmable device and may be connected to one or more memories 31, in which instructions executable by the logic circuit can be stored, for instance during manufacturing of the logic unit or after manufacturing. The logic circuit 20 may for example be part of a microprocessor. The microprocessor may for example include a central processing unit (CPU) and/or a coprocessor and/or a digital signal processor and/or an embedded processor. The logic circuit 20 may also be part of a microcontroller (μC), such as a controller for an electronic stability control (ESC) system used to modulate braking and traction forces of a vehicle, such as a car.

As shown in FIG. 3, the logic circuit 2 may for instance include one, or more, processor cores 30 which can execute the instructions in the memory 31 connected to the processor core. At least a part of the processor core may then be tested by a test application. The processor core may for instance include the logic required to execute program code in the form of machine code. The processor core 30 may for instance at least include an instruction decoder, an arithmetic unit, an address generation unit, and a load/store unit. The microprocessor may for example include, in addition to the processor core, inputs/outputs 301,302 or other components 32-34, such as and/or communication interfaces and/or coprocessors and/or analog-to-digital converters and/or clocks and reset generation units, voltage regulators, memory (such as for instance flash, EEPROM, RAM), error correction code logic and/or timers or other suitable components.

As shown in FIG. 3, for instance, the test routine modules 27 and/or the test module 26 may include a memory 31 connectable to the logic circuit 20 in which memory sets of data 245,265,275 representing one or more set of instructions executable by the logic circuit 20 are stored, the set forming for instance one or more test routines $TR_1 \ldots TR_N$ and/or the test application TSH. As shown in FIG. 3, for instance, in the memory 31 a set 245 forming the data processing application APP may be stored. Also, in the memory 31 a set of instructions 265 forming the test application TSH may be stored and/or one or more sets 275 of instructions forming the test routines $TR_1 \ldots TR_N$. Parts 246, 266, 277 of logic circuit 20 may execute the instructions and hence operate, respectively as a data processing application module, a test module or a self-testing part.

Figure 4:
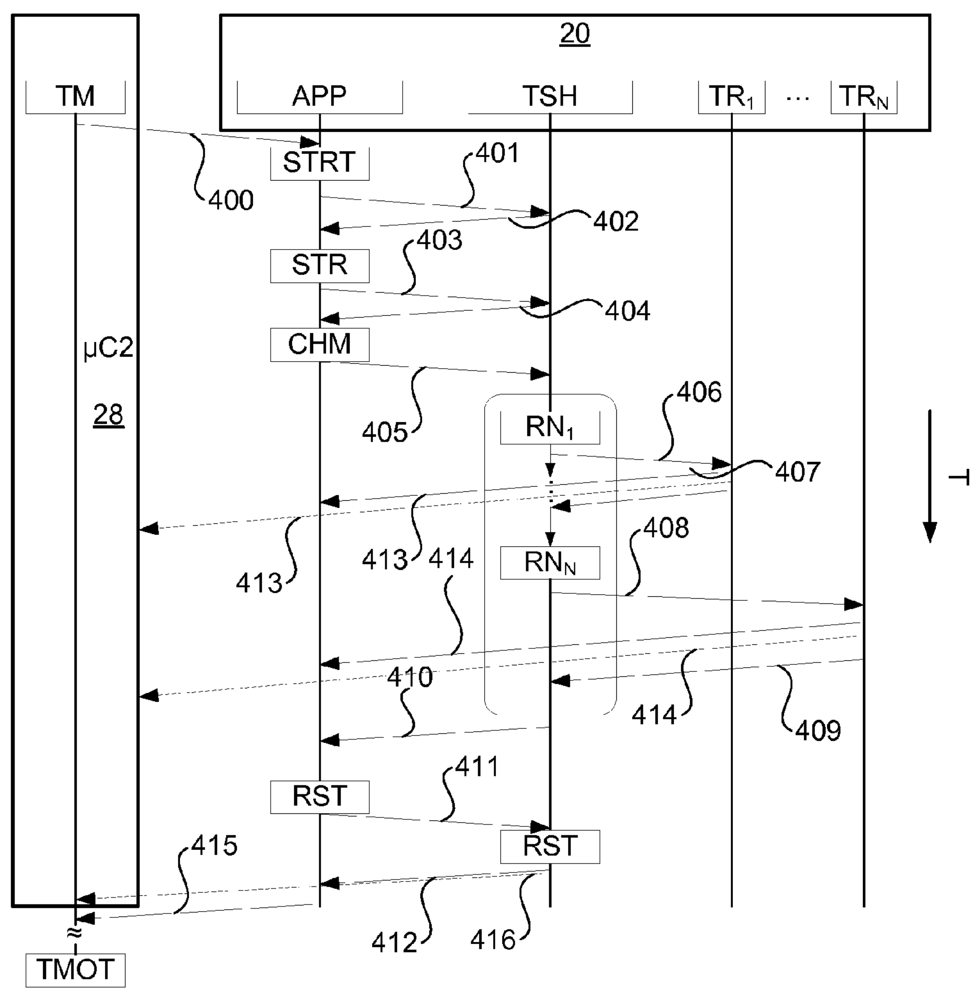
FIG. 4 shows an example of a timing diagram suitable for a system for testing a logic circuit.

The examples shown in FIG. 2 or 3 may for example perform a method as is illustrated in FIG. 4. In FIG. 4, different steps or executed by the modules 24, 26-28 in the system 2 are shown as a function of time T. As shown in FIG. 4, a method for testing (at least) a part of the logic circuit 2, may be initiated by the monitoring unit 28, which in FIG. 4 is shown as a separate microcontroller μC2. The monitoring unit 28 may, for example periodically, sent a message 400 to the data processing application APP. The monitoring unit 28 may further start a safety timer TM. The data processing application APP may in response to the message 400 perform a start STRT and transmit a test activation signal 401 to the test module 26. In response to the test activation signal 401, the test application TSH may be executed.

The test application TSH may for instance transmit a resource release request 402 to the data processing application, in order to obtain an authorization from the data processing application to test or use a resource, that is a part of the logic circuit 20. The data processing application APP may grant the resource release request 402 and store in response to the resource release request 402, in context store step STR, the context for the resource, such as such as the data being processed by the resource or configurable parameters, such as which interrupt request lines are enabled or disabled or other settings, in a buffer memory, such as a register included in the logic circuit 20. The data processing application APP may then transmit a resource released notification 403 to the test application TSH.

When the requested resource is released, the test application TSH may transmit a configuration request 404 to the data processing application APP. The data processing application APP may perform a configuration step CHM in response to the configuration request 404. The data processing application APP may for instance set the logic circuit 20 to a mode required to perform a certain test routine, such as a supervisor mode, enable or disable interrupts, enable or disable cache memory or other parameters of the logic circuit.

The data processing application APP may also or alternatively configure the desired resource in accordance with the requirements of the test routine(s) TR to be performed. For example, an interrupt controller may be configured to trigger a specific interrupt depending on a specific event performed by the self-testing part. Also, for instance, a memory management unit (MMU) may be programmed to map the address space of the self-testing part to a specific range.

When the logic circuit and the resources have the required configuration, the data processing application APP may send a configuration acknowledge notification 405 to the test application TSH.

When the logic circuit 20 and the resources have the required configuration, for instance in response to receiving the configuration acknowledge notification 405, the test application TSH may run the test routines $TR_1 \ldots TR_N$ in test steps $RN_1 \ldots RN_N$, as indicated in FIG. 4 with arrows 406, 408. The thus started test routine may perform the test on the respective part 277, for instance using the configured resource, and return the result of the test in a test result message 407, 409 to the test application TSH. The respective test routine $TR_1 \ldots TR_N$ may for instance output, by means of the test result message 407,409, whether or not the tested resource has passed the test and for example a test value which has been calculated during the test.

As shown in FIG. 4, the test routines $TR_1$,$TR_N$ may transmit test routine messages 413, 414 to the data processing application APP and/or the monitoring unit 28 without passing through the test module TSH. The test routine messages 413, 414 may for instance include the result of the individual test performed by the respective test routine, and for example include an indication of the integrity of the tested part of the logic circuit 20 and/or one or more values determined during the test. The value may for example be a number which has been calculated by the test routine and is checked for correctness if the resources has performed the calculation correctly. In case a test routine outputs to the test application TSH information that the respective self-testing part 277 has failed the self-test or does not output within a predetermined period of time a test result, the test application TSH may for example determine that the logic circuit 20 has failed the test. The test application TSH may then terminate the execution of the test routines and return, as indicated with arrow 410 an overall test result to the data processing application APP and/or the monitoring unit 28.

As shown in FIG. 4, the test application TSH may initiate the executing of a following test routine $TR_{+1}$ when a test routine has been executed and result messages 407,413 resp. 409,414 have been outputted which indicate that the respective self-tested part 277 of the logic circuit 20 has passed the self-test.

When the test routines $TR_1 \ldots TR_N$ required to perform the test have been executed, the test application TSH may sent a test performed notification 410 to the data processing application APP. The data processing application APP may then restore the configuration of the resource.

When the test routines required to perform the test have been executed, the test application TSH may determine as an overall test result, in result determining step RST, that the logic circuit 20 has passed the test and determine from received test signatures of one, two or more of the test routines an overall test signature. As shown in FIG. 4, the test application TSH may output an overall test result message 412,416 which e.g. includes the overall test signature, to the data processing application APP and/or the monitoring unit 28. The overall test result message 412,416 may for example be outputted by the test application TSH when the data processing application APP has transmitted a resource restored message to the test data processing application TSH.

The data processing application APP may output to the monitoring unit 28 a test finished message 415 in response to receiving the overall test result message 412. The monitoring unit 28 may then stop the safety timer SP. The data processing application APP may further output to the monitoring unit 28 the result of the test. Thereby, the monitoring unit 28 may verify that the logic unit 20 is functioning correctly. As shown in FIG. 4, in case the safety timer may time-out in case the test finished message 413 has not been received within a threshold time. The monitoring unit 28 may, in response to said time-out, for example reset the logic circuit 20 or trigger a transition to a safe state.

The invention may also be implemented in a computer program for running on a computer system, at least including code portions for performing steps of a method according to the invention when run on a programmable apparatus, such as a computer system or enabling a programmable apparatus to perform functions of a device or system according to the invention. Such a computer program may be provided on a data carrier, such as a CD-ROM or diskette, stored with data loadable in a memory of a computer system, the data representing the computer program. The data carrier may further be a data connection, such as a telephone cable or a wireless connection. The computer program product may for instance include program code portions for executing a test application and/or a test routine and/or a module.

The computer program may include a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

In the foregoing specification, the invention has been described with reference to specific examples of embodiments of the invention. It will, however, be evident that various modifications and changes may be made therein without departing from the broader spirit and scope of the invention as set forth in the appended claims. For instance, the memory 31 may include any medium suitable to store information, such as for instance a register, random access memory (RAM), cache memory or any other medium suitable to store information. The memory may for instance be a volatile or non-volatile memory.

Also, for example, the test routine output interface may include a software output interface and/or a hardware output interface. Furthermore, for instance, the test application may be for example executable separate from the data processing application or be implemented as a library or other source of instructions that can be executed by the data processing application. Also, a faulty behaviour of the logic circuit 20 may for instance be caused by the temperature of the logic circuit, the environment of the logic circuit, the clock of the logic circuit, physical defects in the logic circuit or any other cause. Also, for example, the test module 26 and/or the data processing application module 24 and/or the monitoring unit 26 may be implemented as devices separate from the logic circuit 20 or may be implemented on a single device and for example be part of the logic circuit 20.

Also, as for example illustrated in FIG. 3, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses For example, the monitoring unit 28 may be implemented on a separate microprocessor or other logic device connectable to the logic circuit 2. Also, devices functionally forming separate devices may be integrated in a single physical device. For example, as e.g. shown in FIG. 3, the test system 25 and the logic circuit 20 may be implemented on the same microprocessor.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. A system comprising:

a logic circuit including a fault-graded self-testing part;

a test routine including a first set of instructions executable by the self-testing part to perform a self-test which, when executed, causes the self-testing part to:

test itself for faulty behavior;

determine a first test result of the self-test, wherein the first test result is fault-graded; and provide output data to a test routine output, wherein the output data is based upon the first result;

a non-fault-graded test module configured to execute a test application, the test application including a second set of instructions which, when executed, causes the logic circuit to perform the test routine and to determine a second test result based on the first test result, wherein the second test result is not fault-graded, and wherein the test module includes:

a control output for activating the execution of the test routine;

a first test module input for receiving the first test result; and a test module output for outputting the second test result;

wherein the test routine output is not connected to the first test module input, and the output data is provided without passing through the test module.

2. The system of claim 1, wherein the test routine further includes a third set of instructions which, when executed, tests for faulty behaviour in at least one of the test routine output, the test module, the test application, the control output, the first test module input, and the test module output.

3. The system of claim 1, wherein the test routine outputs a predetermined result.

4. The system of claim 1, wherein the test routine simulates a fault in the logic circuit.

5. The system of claim 1, wherein the test routine output includes at least one of a software output interface and a hardware output interface.

6. The system of claim 1, wherein at least one of the test routine and the test module includes a memory connectable to the logic circuit, and which stores at least one of the first set of instructions and the second set of instructions.

7. The system of claim 1, wherein the logic circuit includes at least one of a microprocessor, a central processing unit, a microcontroller, and a digital signal processor.

8. The system of claim 7, wherein:

the first set of instructions and the second set of instructions are executable by a processor; and the self-testing part includes a portion of the processor.

9. The system of claim 1, further comprising a monitoring unit connected with a monitoring unit input to at least one of the test module output and the test routine output, the monitoring unit including a control output connectable to the logic circuit, for controlling a part of the logic circuit based on information received at the monitoring unit input.

10. The system of claim 1, wherein the test module is configured to execute the test application in response to a test request and includes a second test module input interface for receiving the test request.

11. The system of claim 1, wherein the logic circuit is arranged to execute a control application for controlling an operation of a physical device.

12. The system of claim 1, further comprising another test routine including a third set of instructions executable by another self-testing part, wherein the self-testing part and the other self testing part are at least partially different from each other.

13. The system of claim 1, wherein the test module is arranged to determine that the logic circuit has a faulty behaviour when a most recently executed test routine reveals a faulty behaviour, and to determine that the logic circuit has a correct behaviour when all of a plurality of test routines have been executed without revealing a faulty behaviour.

14. The system of claim 1, wherein the test module includes a second control output interface for outputting a request to use a resource of the logic circuit to a controller of the resource.

15. The system of claim 14, wherein the test module is arranged to release the requested resource when the request is denied and refrain from performing a test routine that requires the requested resource.

16. The system of claim 1, including a monitoring unit connected with a monitoring unit input interface to at least one of the test module output interface and the test routine output interface, wherein the monitoring unit includes a control output connectable to the logic circuit for controlling the part based on the information.

17. A method for testing a logic circuit, the method comprising:

executing by a non-fault graded hardware test module a test application, the test application including instructions for subjecting a fault-graded part of the logic circuit to a self-test; and in response to the self-test:

causing the fault-graded part to execute a self-test routine, including testing the fault-graded part for faulty behavior, and determining a self-test result based on the testing, wherein the self-test result is fault-graded;

determining an overall test result based on the self-test result;

outputting by the fault-graded part, the self-test result to the test module; and outputting by the fault-graded part, data to a test routine output interface which is not connected to the test module, the data including information about the self-test result, wherein the data is outputted without passing through the test module, and is fault-graded.

18. The method of claim 17, wherein determining the overall test result further comprises testing for faulty behaviour in at least one of a test routine output, the test module, the test application, a control output, a test module input, and a test module output.

19. The method of claim 17, wherein executing the test application is in response to a test request.

* * * * *